(12) United States Patent
Motoyama et al.

(10) Patent No.: US 12,341,100 B2
(45) Date of Patent: Jun. 24, 2025

(54) COPPER INTERCONNECTS WITH SELF-ALIGNED HOURGLASS-SHAPED METAL CAP

(71) Applicant: International Business Machines Corporation, Armonk, NY (US)

(72) Inventors: Koichi Motoyama, Clifton Park, NY (US); Chanro Park, Clifton Park, NY (US); Kenneth Chun Kuen Cheng, Shatin (HK); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 721 days.

(21) Appl. No.: 17/450,470

(22) Filed: Oct. 11, 2021

(65) Prior Publication Data
US 2023/0110587 A1    Apr. 13, 2023

(51) Int. Cl.
*H01L 23/532*    (2006.01)
*H01L 23/528*    (2006.01)

(52) U.S. Cl.
CPC .... *H01L 23/53238* (2013.01); *H01L 23/5283* (2013.01)

(58) Field of Classification Search
CPC ........... H01L 21/76849; H01L 23/5283; H01L 23/53238
See application file for complete search history.

(56) References Cited

U.S. PATENT DOCUMENTS

| | | | | |
|---|---|---|---|---|
| 5,466,635 A * | 11/1995 | Lynch | ................. | H05K 3/3436 |
| | | | | 257/E23.068 |
| 7,105,445 B2 * | 9/2006 | Wong | ................. | H01L 23/53238 |
| | | | | 257/E21.174 |
| 7,745,324 B1 * | 6/2010 | Yang | ................. | H01L 21/76886 |
| | | | | 438/629 |
| 8,143,125 B2 * | 3/2012 | Purtell | ................. | H10D 30/668 |
| | | | | 257/330 |
| 8,143,162 B2 * | 3/2012 | Yu | ..................... | H01L 21/76826 |
| | | | | 257/E23.145 |
| 8,476,765 B2 | 7/2013 | Zhang | | |
| 8,623,755 B2 | 1/2014 | Liu | | |
| 9,281,278 B2 | 3/2016 | Li | | |
| 9,627,321 B2 | 4/2017 | Boyanov | | |

(Continued)

FOREIGN PATENT DOCUMENTS

WO    2011123368 A1    10/2011

OTHER PUBLICATIONS

Meng et al; "Parylene Etching Techniques for Microfluidics and BioMEMS". 18th IEEE International Conference on Micro Electro Mechanical Systems, 2005, 9 Pgs.

(Continued)

*Primary Examiner* — Zandra V Smith
*Assistant Examiner* — John M Parker
(74) *Attorney, Agent, or Firm* — Matthew Zehrer

(57) ABSTRACT

A copper interconnect with self-aligned hourglass-shaped metal cap comprises a plurality of interconnect lines formed in a dielectric layer of a semiconductor device. The copper interconnect further comprises a metal cap formed on top of each interconnect line of the plurality of interconnect lines, where the metal cap is formed with self-aligning concave sides extending from a top surface of the dielectric layer to a top surface of the metal cap.

18 Claims, 4 Drawing Sheets

(56) References Cited

U.S. PATENT DOCUMENTS

| | | | | |
|---|---|---|---|---|
| 9,799,555 | B1* | 10/2017 | Zhang | H01L 23/53209 |
| 11,942,426 | B2* | 3/2024 | Nguyen | H01L 21/76897 |
| 2005/0001324 | A1* | 1/2005 | Dunn | G01L 19/0069 |
| | | | | 257/E23.06 |
| 2008/0197500 | A1* | 8/2008 | Yang | H01L 23/53223 |
| | | | | 257/E23.141 |
| 2009/0189287 | A1* | 7/2009 | Yang | H01L 21/76826 |
| | | | | 257/769 |
| 2010/0038782 | A1* | 2/2010 | Yang | H01L 21/76846 |
| | | | | 438/653 |
| 2014/0332960 | A1* | 11/2014 | Yang | H01L 23/5329 |
| | | | | 257/751 |
| 2015/0170961 | A1* | 6/2015 | Romero | H01L 21/28506 |
| | | | | 438/641 |
| 2015/0228585 | A1 | 8/2015 | He | |
| 2018/0082845 | A1* | 3/2018 | Adusumilli | H01L 23/495 |
| 2019/0363008 | A1 | 11/2019 | Gstrein | |
| 2020/0020580 | A1* | 1/2020 | Lee | H01L 21/0228 |
| 2020/0105591 | A1* | 4/2020 | Lin | H01L 21/76837 |
| 2021/0125863 | A1 | 4/2021 | Clark | |
| 2022/0068666 | A1* | 3/2022 | Lee | H01L 21/563 |
| 2022/0122907 | A1* | 4/2022 | Tang | H01L 24/13 |

OTHER PUBLICATIONS

Pearton et al;, "Dry Etching of Electronic Oxides, Polymers, and Semiconductors". Plasma Processes and Polymers, 2005, 2, DOI:10.1002/ppap.20040035, 22 Pgs.

Vaeth et al; "Transition Metals for Selective Chemical Vapor Deposition of Parylene-Based Polymers", Chem. Mater. 2000, 12, 9 Pgs.

Wu et al; "Pathfinding of Ru-Liner/Cu-Reflow Interconnect Reliability Solution", 2018 IEEE Xplore, Downloaded Oct. 5, 2021, pp. 1-2.

Wu et al. "Effects of capping layers on the electrical characteristics of nickel silicided junctions", Microelectronic Engineering, May-Aug. 2007, pp. 1801-1805, vol. 84, Issues 5-8.

* cited by examiner

COPPER INTERCONNECTS WITH SELF-ALIGNED HOURGLASS-SHAPED METAL CAP

BACKGROUND

The present invention relates generally to the fabrication of semiconductor devices, and more particularly to copper (Cu) interconnects with self-aligned hourglass-shaped metal cap.

In integrated circuits (ICs), interconnects are structures that connect two or more circuit elements (such as transistors) together electrically. The design and layout of interconnects on an IC is vital to its proper function, performance, power efficiency, reliability, and fabrication yield. The material that interconnects are made from depends on many factors. Chemical and mechanical compatibility with the semiconductor substrate and the dielectric in between the levels of interconnect is necessary, otherwise barrier layers are needed. Suitability for fabrication is also required; some chemistries and processes prevent integration of materials and unit processes into a larger technology (recipe) for IC fabrication. In fabrication, interconnects are formed during the Back End of Line (BEOL) after the fabrication of the transistors on the substrate.

Copper interconnects are used in silicon ICs to reduce propagation delays and power consumption. Since copper is a better conductor than aluminum, ICs using copper for their interconnects can have interconnects with narrower dimensions and use less energy to pass electricity through them. Together, these effects lead to ICs with better performance. The transition from aluminum to copper required significant developments in fabrication techniques, including radically different methods for patterning the metal as well as the introduction of barrier metal layers to isolate the silicon from potentially damaging copper atoms.

Time-Dependent Dielectric Breakdown (TDDB) is a kind of transistor aging, a failure mechanism in MOSFETs, when the gate oxide breaks down as a result of long-time application of relatively low electric field (as opposed to immediate breakdown, which is caused by strong electric field). The breakdown is caused by formation of a conducting path through the gate oxide to substrate due to electron tunneling current, when MOSFETs are operated close to or beyond their specified operating voltages.

SUMMARY

Embodiments of the present invention include copper interconnects with self-aligned hourglass-shaped metal caps and a method of making the same. The interconnect structure comprises a plurality of interconnect lines formed in a dielectric layer of a semiconductor device. The copper interconnect further comprises a metal cap formed on top of each interconnect line of the plurality of interconnect lines, where the metal cap is formed with self-aligning concave sides extending from a top surface of the dielectric layer to a top surface of the metal cap.

The method of making the copper interconnects with self-aligned hourglass-shaped metal caps includes forming a plurality of cut cavities in a layer of a dielectric material on an interconnect structure, wherein each cut cavity of the plurality of cut cavities forms a line cut. Next, a barrier material is deposited over a first exposed surfaces of each cut cavity of the plurality of cut cavities to form a barrier in each cut cavity. Next, a liner material is deposited over a second exposed surfaces of the barrier material. Next, the plurality of cut cavities is filled with a first metal. Next, a top surface is planarized to form one or more lines. Next, a sacrificial dielectric is selectively deposited over a third exposed surfaces of the dielectric layer, wherein the sacrificial dielectric forms a convex shape over the cut cavities. Next, a second metal is deposited on the first exposed surfaces of each cut cavity of the plurality of cut cavities to form a metal cap on each line of the one or more lines. Next, the sacrificial dielectric is removed to expose side walls of the second metal, wherein the side walls of the second metal have a concave shape. Finally, a conformal dielectric cap is deposited over the first exposed surfaces of each cut cavity of the plurality of cut cavities and the third exposed surfaces of the dielectric layer.

DETAILED DESCRIPTION

Figure 1:
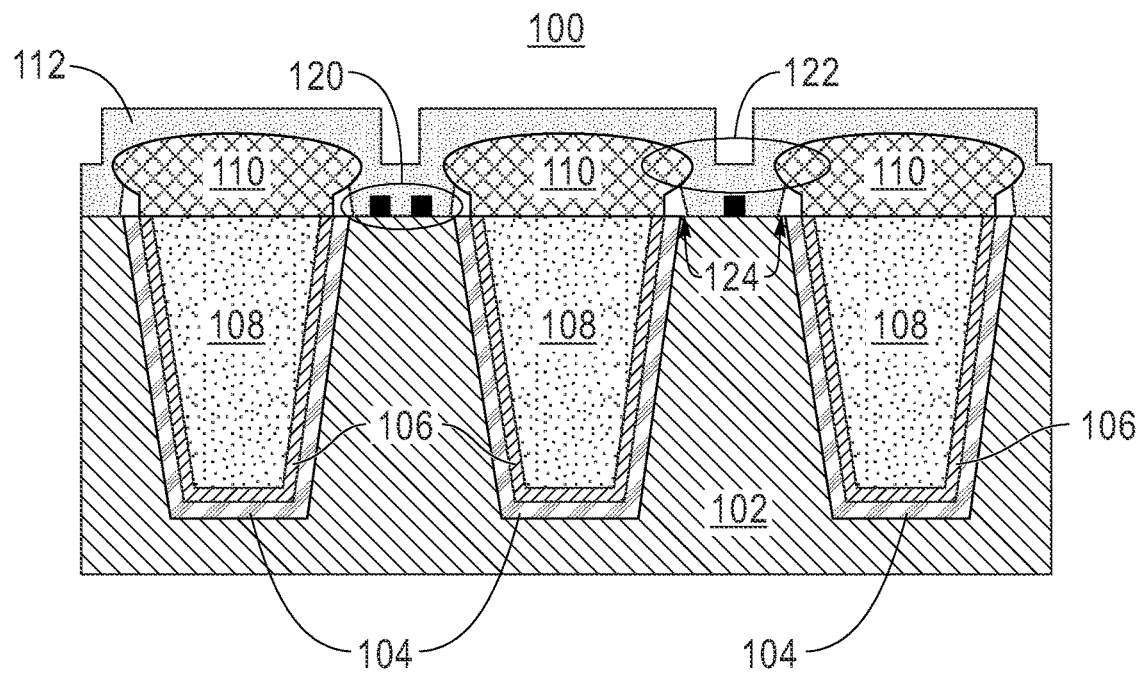
FIG. 1 depicts a cross-sectional view of an interconnect structure including a thick metal cap in a semiconductor device.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps depicted can be combined as an integrated process step. In addition, descriptions of well-known functions and constructions may be omitted for clarity and conciseness.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For BEOL copper interconnects, a metal cap process (e.g., cobalt (Co)) has been widely used for enhanced Electromigration (EM) performance. It is well known that thicker metal cap can give better EM performance. However, the thick metal cap process has several issues that need to be addressed. Metal residue, lateral growth of a thick metal, and poor dielectric cap coverage due to the undercut structure of the thick metal cap can cause TDDB and performance degradation.

Embodiments of the present invention generally provide a new process of forming a thick metal cap in a semiconductor device. Embodiments of the present invention utilize copper interconnects with self-aligned hourglass-shaped metal caps. Copper interconnects with self-aligned hourglass-shaped metal caps provide better EM performance with thicker metal caps, good TDDB performance due to having sufficient space between lines without metal residues, and no serious undercut issues of a thick metal cap which leads to adequate dielectric coverage. For a conventional cap process, when depositing a thick cap metal, there are typically undercut issues that lead to poor dielectric cap coverage. Copper interconnects with self-aligned hourglass-shaped metal caps provide for minimum lateral growth of metal cap with no metal residue between lines, preventing any serious undercut issues and providing adequate dielectric cap coverage with no voids.

FIG. 1 depicts a cross-sectional view of interconnect structure 100 including a thick metal cap in a semiconductor device as would be fabricated currently. Interconnect structure 100 includes dielectric 102, typically a low-k dielectric constant material; barrier 104, which may be, for example, Tantalum nitride (TaN); and liner 106, which may be, for example, Ruthenium (Ru), around copper interconnect 108. Interconnect structure 100 also includes metal cap 110 and cap dielectric 112, which may be, for example, silicon carbonitride (SiCN). This method of fabrication, however, leads to several issues. Metal residue 120 and lateral metal growth 122 can cause TDDB degradation. As the example of FIG. 1 shows, for a conventional cap process, when depositing a thick cap metal, there are typically undercut issues 124 which causes poor dielectric cap coverage. This poor dielectric cap coverage due to the undercut structure of thick metal caps can also cause TDDB degradation.

Figure 2:
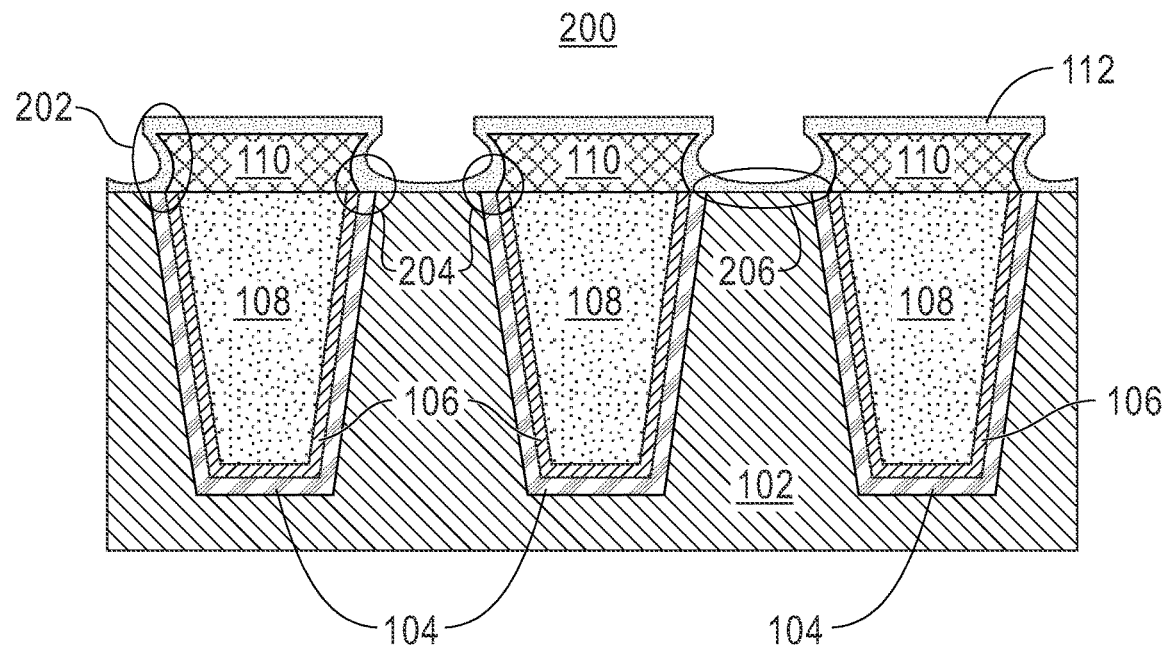
FIG. 2 depicts a cross-sectional view of an interconnect structure including a thick self-aligned hourglass-shaped metal cap in a semiconductor device, in accordance with an embodiment of the present invention.

FIG. 2 depicts a cross-sectional view of interconnect structure 200 including a thick self-aligned hourglass-shaped, i.e., concave, metal cap in a semiconductor device, in accordance with an embodiment of the present invention. In contrast to the example of FIG. 1, the self-aligned hourglass-shaped metal cap 202 of interconnect structure 200 restricts the lateral growth of the metal cap. As can be seen in detail 204, the present invention provides adequate dielectric cap coverage with no voids. Detail 206 shows that no metal residues exist between lines using the present invention. Together these features provide for better EM performance with a thicker metal cap, with good TDDB performance due to having sufficient space between lines without metal residues, and no serious undercut issue of a thick metal cap which leads to adequate dielectric coverage.

Figure 3:
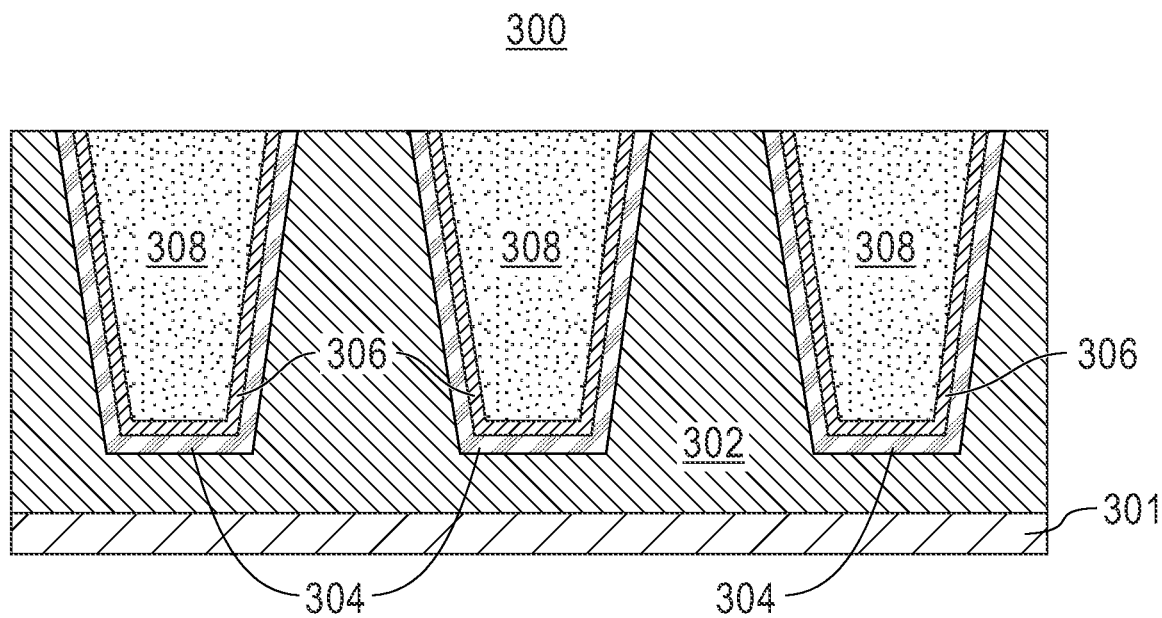
FIG. 3 depicts a cross-sectional view of the interconnect structure after fabrication steps depositing copper, a liner, and a barrier, and Chemical Mechanical Polishing (CMP) on a layer of a semiconductor, in accordance with an embodiment of the present invention.

FIG. 3 depicts a cross-sectional view of interconnect structure 300 after fabrication steps depositing copper, a liner, and a barrier, and Chemical Mechanical Polishing (CMP) on a layer of a semiconductor, in accordance with an embodiment of the present invention. Since the present invention is directed to BEOL semiconductor fabrication, substrate layer 301 is illustrated as a generic layer. However, in various embodiments, substrate layer 301 may be a semiconductor wafer or may be a layer containing circuitry manufactured during front end of line (FEOL) processes such as, for example, transistors, capacitors, resistors, etc.

In the cross-sectional view of FIG. 3, dielectric 302 has been deposited on substrate layer 301. In an embodiment, dielectric 302 is dielectric 102 from FIGS. 1-2. In an embodiment, dielectric 302 is a low-k dielectric, e.g., SiCOH. In an embodiment, dielectric 302 is deposited or formed on exposed surfaces of substrate layer 301, e.g., substrate 101 from FIGS. 1-2, using conventional processes. In the cross-sectional view of FIG. 3, after dielectric 302 is deposited on substrate layer 301, cut cavities are etched into dielectric 302, and barrier 304, liner 306, and copper 308, e.g., barrier 104, liner 106, and copper interconnect 108, respectively, from FIG. 1 and FIG. 2, are deposited. In an embodiment, barrier 304 may be, for example, TaN. In an embodiment, liner 306 may be, for example, Ru.

In an embodiment, after the deposition of copper 308, the surface of the device is planarized using, for example, Chemical Mechanical Polishing (CMP).

Figure 4:
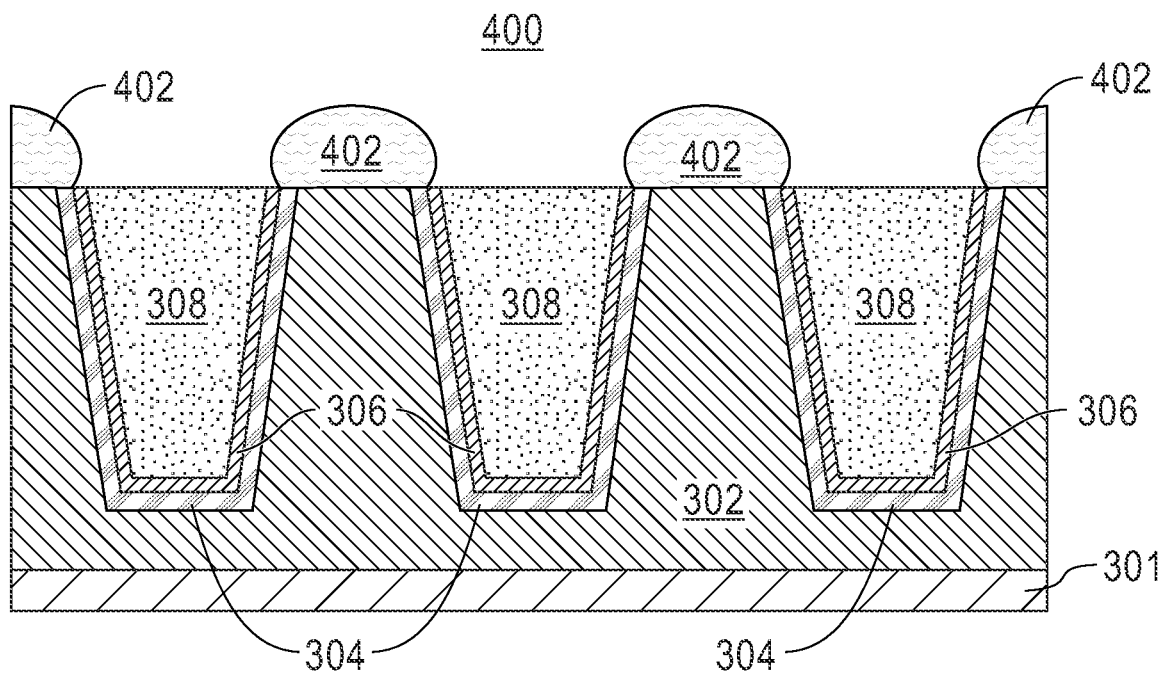
FIG. 4 depicts a cross-sectional view of the interconnect structure after fabrication steps to selectively deposit a sacrificial dielectric, in accordance with an embodiment of the present invention.
Figure 8A:
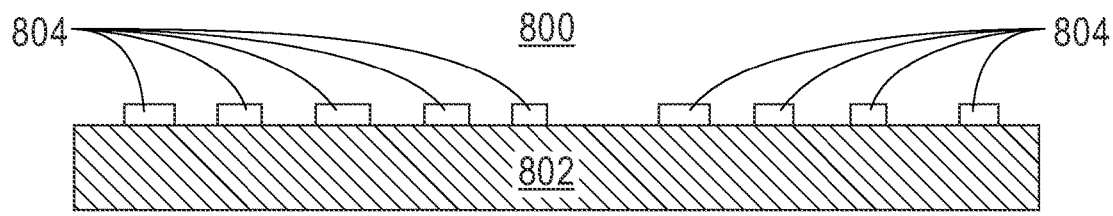
FIG. 8A depicts a cross-sectional view of an interconnect structure after fabrication steps to selectively deposit an inhibitor on the surface of a layer of a semiconductor device, in accordance with an embodiment of the invention.
Figure 8B:
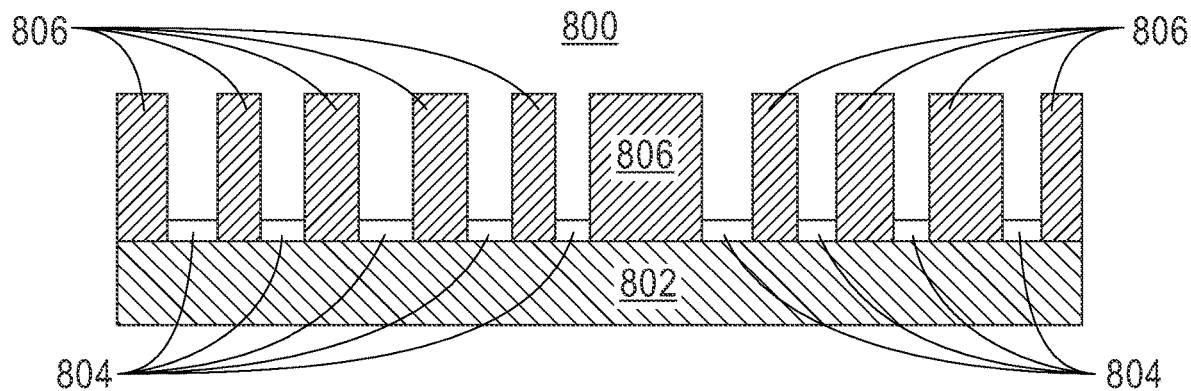
FIG. 8B depicts a cross-sectional view of the interconnect structure of FIG. 8A after fabrication steps to selectively deposit a sacrificial dielectric on the surface of a layer of a semiconductor device, in accordance with an embodiment of the invention.

FIG. 4 depicts a cross-sectional view of interconnect structure 400 after fabrication steps to selectively deposit a sacrificial dielectric, in accordance with an embodiment of the present invention. In the embodiment illustrated in FIG. 4, sacrificial dielectric 402 has been deposited on the top surface. In an embodiment, sacrificial dielectric 402 has convex sides to form the concave edges, or hourglass shapes, in the metal caps. In an embodiment, sacrificial dielectric 402 is Parylene. In another embodiment, sacrificial dielectric 402 may be any appropriate dielectric that can be selectively etched as would be known to a person of skill in the art. The selective deposition of Parylene as sacrificial dielectric 402 is illustrated in FIGS. 8A and 8B below.

Figure 5:
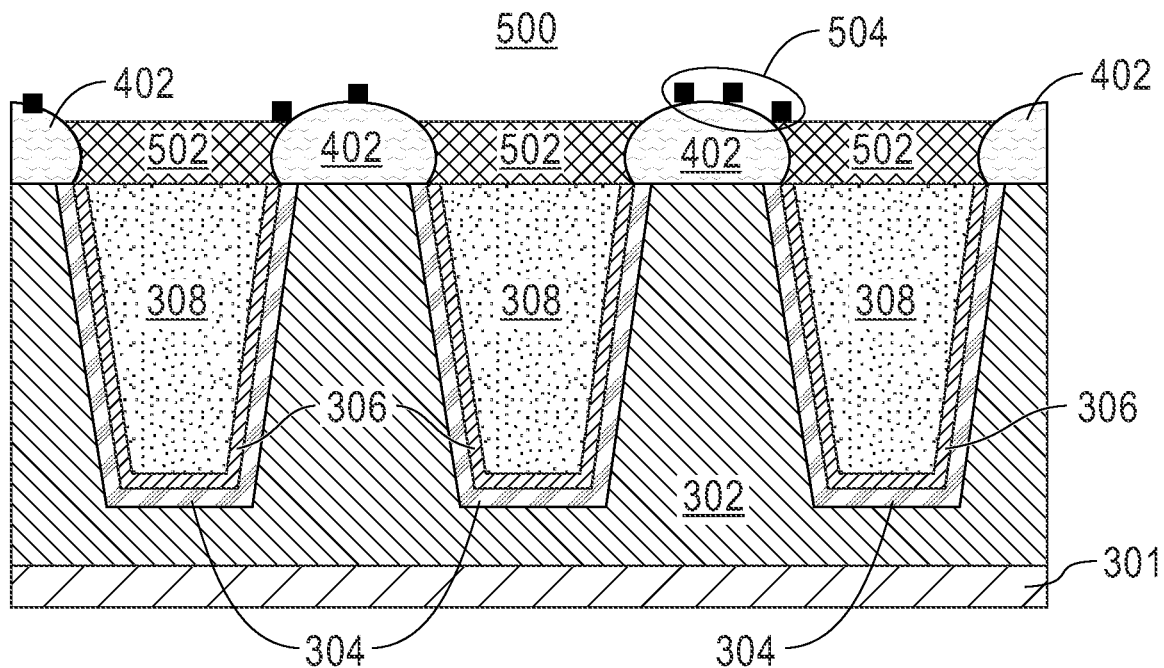
FIG. 5 depicts a cross-sectional view of the interconnect structure after fabrication steps to deposit a thick metal cap, in accordance with an embodiment of the present invention.

FIG. 5 depicts a cross-sectional view of interconnect structure 500 after fabrication steps to deposit a thick metal cap, in accordance with an embodiment of the present invention. In the structure of FIG. 5, interconnect structure 500 has been metallized with metal 502, e.g., metal cap 110 from FIGS. 1-2, to fill the trenches between sacrificial dielectric 402. In an embodiment, Chemical Vapor Deposition (CVD) may be used to deposit metal 502 on the exposed surface of the device. In an embodiment, metal 502 may be Cobalt (Co). In another embodiment, metal 502 may be Ru, TaN, or Tungsten Nitride (WN). In an embodiment, metal 502 may range in thickness from 1 nm to 20 nm.

In an embodiment, the deposition of metal 502 may leave metal residues 504 on the surface of the device. As mentioned above, metal residues 504 can cause Time-Dependent Dielectric Breakdown (TDDB) and performance degradation.

Figure 6:
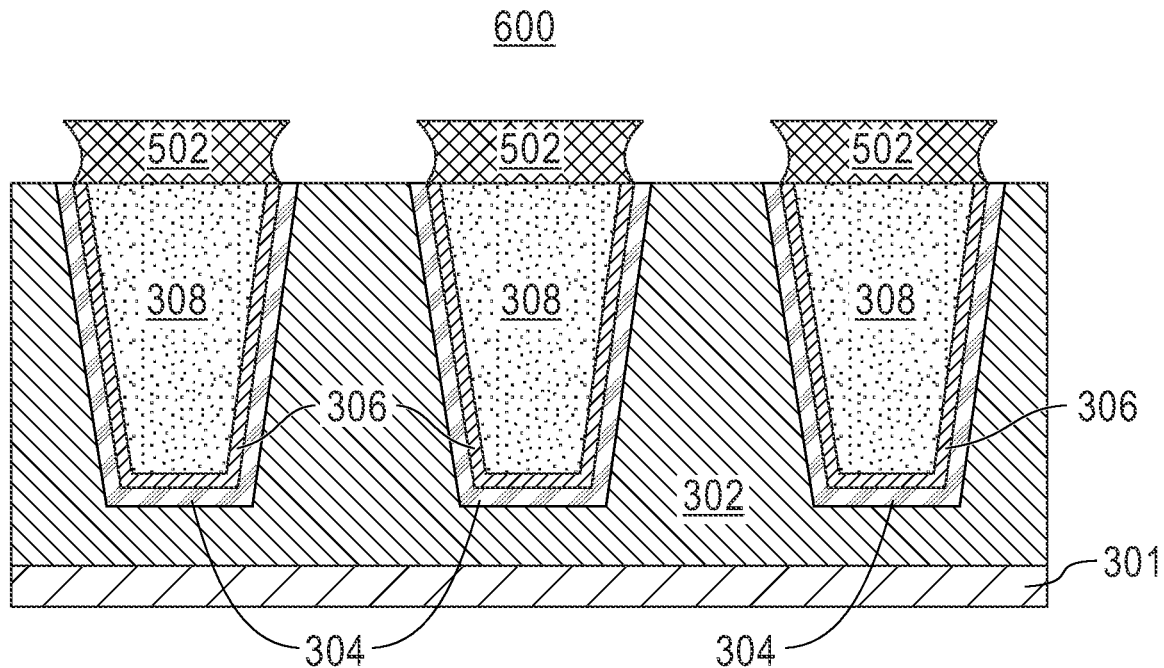
FIG. 6 depicts a cross-sectional view of the interconnect structure after fabrication steps to remove the sacrificial dielectric, in accordance with an embodiment of the present invention.

FIG. 6 depicts a cross-sectional view of interconnect structure 600 after fabrication steps to remove the sacrificial dielectric, in accordance with an embodiment of the present invention. In the structure of FIG. 6, a selective etch procedure has been used to remove sacrificial dielectric 402, exposing the concave side walls of the metal cap, and leaving self-aligned hourglass-shaped metal caps in metal 502.

Figure 7:
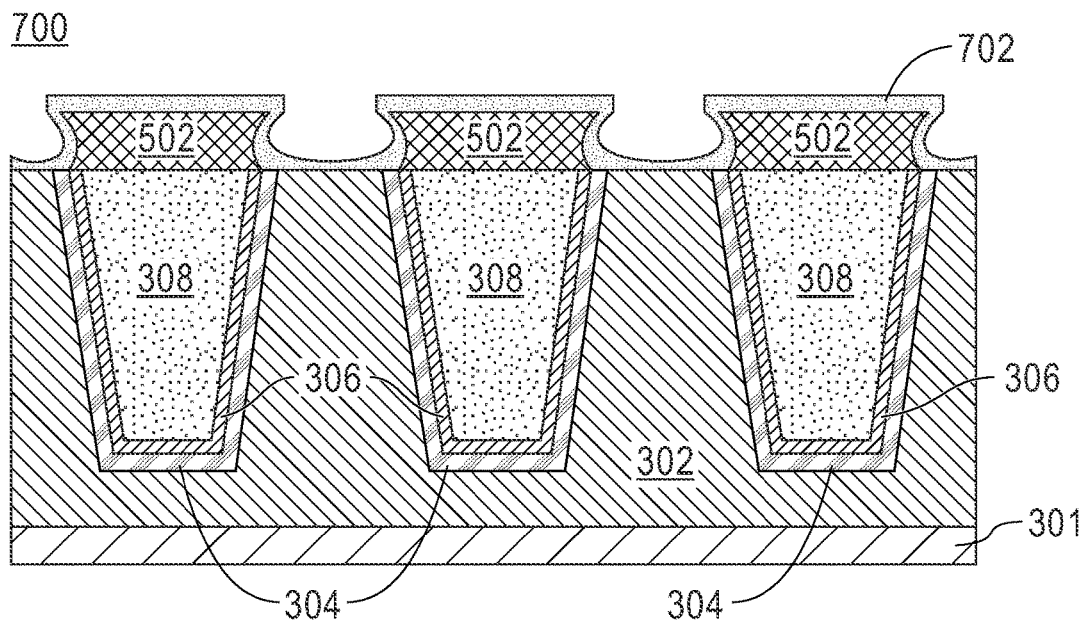
FIG. 7 depicts a cross-sectional view of the interconnect structure after fabrication steps to deposit a dielectric cap using conformal Atomic Layer Deposition (ALD), in accordance with an embodiment of the invention.

FIG. 7 depicts a cross-sectional view of interconnect structure 700 after fabrication steps to deposit dielectric cap 702 on the exposed top surface of interconnect structure 700, in accordance with an embodiment of the invention. In an embodiment, the dielectric cap is deposited using conformal Atomic Layer Deposition (ALD). In an embodiment, the dielectric cap may be SiCN.

FIG. 8A depicts a cross-sectional view of interconnect structure 800 after fabrication steps to selectively deposit an inhibitor on the surface of layer 802. In FIG. 8A, layer 802 is illustrated as a semiconductor substrate, but in practice layer 802 may be any appropriate layer of the semiconductor device. For example, in the view of interconnect structure 400 in FIG. 4, layer 802 represents the top surface of the device after CMP. In an embodiment, layer 802 is a non-inhibitor, i.e., a material that will not inhibit deposition of the sacrificial dielectric, e.g., sacrificial dielectric 402 from FIGS. 4-5. Interconnect structure 800 includes inhibitors 804, which have been selectively deposited on the top of layer 802 to prevent deposition of the sacrificial dielectric. Various materials, including Tantalum (Ta), Iron (Fe), Ruthenium (Ru), Cobalt (Co), Nickel (Ni), Palladium (Pd), Platinum (Pt), Copper (Cu), Silver (Ag), Gold (Au) are good inhibitor materials. In an embodiment, any appropriate inhibitor material may be used.

FIG. 8B depicts a cross-sectional view of interconnect structure 800 of FIG. 8A after fabrication steps to selectively deposit a sacrificial dielectric on the surface of layer 802. In FIG. 8B, sacrificial dielectric 806 is deposited on the exposed areas of layer 802 wherever inhibitors 804 are not present. In an embodiment, sacrificial dielectric 806 is sacrificial dielectric 402 from FIGS. 4-5. In an embodiment, sacrificial dielectric 806 is Parylene. In an embodiment, the Parylene of sacrificial dielectric 806 allows for selective growth on layer 802 between inhibitors 804, thereby allowing for self-aligned deposition of the metal layer, e.g., metal 502 of FIGS. 5-7, to form hourglass-shaped metal caps.

What is claimed is:

1. An interconnect structure comprising:
   a plurality of interconnect lines formed in a dielectric layer of a semiconductor device;
   a metal cap formed on top of each interconnect line of the plurality of interconnect lines, wherein the metal cap comprises one or more concave sides extending from a top surface of the dielectric layer to a top surface of the metal cap; and
   a dielectric cap upon at least the one or more concave sides.

2. The interconnect structure of claim 1, wherein the plurality of interconnect lines are formed of copper (Cu).

3. The interconnect structure of claim 1, wherein the metal cap on the top of each interconnect line of the plurality of interconnect lines is formed of cobalt (Co).

4. The interconnect structure of claim 1, wherein the dielectric layer is a low-k dielectric constant material.

5. The interconnect structure of claim 1, wherein the one or more concave sides of the metal cap prevent metal residue forming between the plurality of interconnect lines.

6. The interconnect structure of claim 1, wherein the one or more concave sides of the metal cap prevent voids between the metal cap and the dielectric layer.

7. The interconnect structure of claim 1, wherein the plurality of interconnect lines formed in the dielectric layer of the semiconductor device comprises:
   a cut etched in the dielectric layer for each interconnect line of the plurality of interconnect lines;
   a barrier material deposited on a first exposed surfaces of the cut etched in the dielectric layer for each interconnect line;
   a liner material deposited on a second exposed surfaces of the barrier; and
   the cut filled by depositing copper to fill the cut etched in the dielectric layer for each interconnect line of the plurality of interconnect lines.

8. The interconnect structure of claim 7, wherein the barrier material is Tantalum nitride (TaN), and the liner material is Ruthenium (Ru).

9. The interconnect structure of claim 1, wherein the dielectric cap is silicon carbonitride (SiCN).

10. An interconnect structure comprising:
- an interconnect line in a dielectric layer of a semiconductor device, wherein a top surface of the interconnect line is coplanar with a top surface of the dielectric layer;
- a metal cap directly upon the top surface of the interconnect line, wherein the metal cap comprises one or more concave sidewalls; and
- a dielectric cap upon at least the one or more concave sidewalls and upon the top surface of the dielectric layer.

11. The interconnect structure of claim 10, wherein the interconnect line is formed of copper (Cu).

12. The interconnect structure of claim 10, wherein the metal cap is formed of cobalt (Co).

13. The interconnect structure of claim 10, wherein the dielectric layer is a low-k dielectric constant material.

14. The interconnect structure of claim 10, wherein the concave sidewalls of the metal cap prevent metal residue forming adjacent to the interconnect line.

15. The interconnect structure of claim 10, wherein the concave sidewalls of the metal cap prevent voids between the metal cap and the dielectric layer.

16. The interconnect structure of claim 10, wherein the interconnect line comprises:
- a cut etched in the dielectric layer;
- a barrier material deposited on a first exposed surfaces of the cut etched in the dielectric;
- a liner material deposited on a second exposed surfaces of the barrier; and
- the cut filled by depositing copper to fill the cut etched in the dielectric layer.

17. The interconnect structure of claim 16, wherein the barrier material is Tantalum nitride (TaN), and the liner material is Ruthenium (Ru).

18. The interconnect structure of claim 10, wherein the dielectric cap is silicon carbonitride (SiCN).

* * * * *